(12) United States Patent
Ray

(10) Patent No.: US 7,688,111 B1
(45) Date of Patent: Mar. 30, 2010

(54) LEVEL-SHIFTING CIRCUIT WITH BIPOLAR JUNCTION TRANSISTOR

(75) Inventor: Abhijit Ray, Sunnyvale, CA (US)

(73) Assignee: SuVolta, Inc., Los Gatos, CA (US)

( * ) Notice: Subject to any disclaimer, the term of this patent is extended or adjusted under 35 U.S.C. 154(b) by 0 days.

(21) Appl. No.: 12/195,725

(22) Filed: Aug. 21, 2008

(51) Int. Cl.
*H03K 19/082* (2006.01)
*H03K 19/0175* (2006.01)

(52) U.S. Cl. .............................. 326/75; 326/76; 326/77; 326/66

(58) Field of Classification Search ........................ None
See application file for complete search history.

(56) References Cited

U.S. PATENT DOCUMENTS 5,304,869 A * 4/1994 Greason ...................... 326/66

2002/0135415 A1 * 9/2002 Dufort ......................... 327/333
2008/0308816 A1   12/2008 Miller et al. .................. 257/76

* cited by examiner

*Primary Examiner*—Anh Q Tran
(74) *Attorney, Agent, or Firm*—Baker Botts L.L.P.

(57) ABSTRACT

A level-shifting circuit includes an input node, a first output transistor, a second output transistor, a pull-up transistor, and an output node. The input node receives an input signal. The first output transistor turns on when the input signal is at a first voltage level and couples an output node to a positive supply voltage when turned on. The second output transistor, a bipolar junction transistor (BJT), couples the output node to a negative supply voltage when turned on. The pull-up transistor turns on when the input signal is at a second voltage level and generates a voltage at a base terminal of the second output transistor that turns the second output transistor on. Additionally, the level-shifting circuit generates, at the output node, an output signal with a voltage swing that includes a positive voltage range and a negative voltage range.

23 Claims, 4 Drawing Sheets

US 7,688,111 B1

LEVEL-SHIFTING CIRCUIT WITH BIPOLAR JUNCTION TRANSISTOR

TECHNICAL FIELD OF THE INVENTION

This invention relates, in general, to electronic circuits and, more particularly, to circuits for shifting the voltage of an input signal.

BACKGROUND OF THE INVENTION

As a result of the rapid technological growth of the past several decades, transistors and other semiconductor devices have become a fundamental building block for a wide range of electronic components. Metal-oxide silicon field-effect transistors (MOSFETs) have been the primary choice for transistors in many applications, including general-use microprocessors, digital signal processors, application specific integrated circuits (ASICs) and various other forms of electronic devices. With the demand for increasingly smaller and faster electronic devices that utilize less power, the inclusion of the metal oxide layer from which MOSFETs derive their name creates significant limitations to further improvements in the size, operating speed, and power requirements of such devices. The use of alternative semiconductor components, such as junction field-effect transistors (JFETs), may facilitate the design of circuits that are smaller and operate on less power. The use of such components may create other design problems however.

SUMMARY OF THE INVENTION

In accordance with the present invention, the disadvantages and problems associated with level-shifting circuits have been substantially reduced or eliminated.

In accordance with one embodiment of the present invention, a level-shifting circuit includes an input node, a first output transistor, a second output transistor, a pull-up transistor, and an output node. The input node is capable of receiving an input signal. The first output transistor turns on when the input signal is at a first voltage level and, when turned on, couples an output node to a positive supply voltage. In a separate branch of the circuit, the pull-up transistor turns on when the input signal is at a second voltage level and, when turned on, generates a voltage at a base terminal of the second output transistor sufficient to turn on the second output transistor. The second output transistor, a bipolar junction transistor (BJT), couples the output node to a negative supply voltage when turned on. The level-shifting circuit generates, at the output node, an output signal with a voltage swing that is greater than the input voltage swing and that includes a negative voltage range.

In accordance with another embodiment of the present invention, a method for processing signals comprises receiving an input signal having a voltage level within an input voltage range at an input node and coupling an output node to a first supply voltage though a first output transistor when the input signal is at a first voltage level within the input voltage range. The method also includes increasing a voltage level at a base terminal of a second output transistor, comprising a bipolar junction transistor (BJT), to a level that is sufficient to turn on the second output transistor. The method also includes coupling the output node to a second supply voltage through the second output transistor when the second output transistor is turned on. Additionally, the method includes generating, at the output node, an output signal having a voltage level within an output voltage range. A voltage swing associated with the output voltage range exceeds the input voltage swing and includes a negative voltage range.

Technical advantages of certain embodiments of the present invention include the ability to generate output signals having a voltage swing greater than that of a received input signal. Certain embodiments may also be capable of generating a voltage swing that spans both negative and positive voltages, in response to an input signal that spans only positive voltages or that spans only negative voltages. Moreover, particular embodiments may incorporate fewer components, operate at higher speeds, and/or use less power than conventional circuits. Other technical advantages of the present invention will be readily apparent to one skilled in the art from the following figures, descriptions, and claims. Additionally, while specific advantages have been enumerated above, various embodiments may include all, some, or none of the enumerated advantages.

BRIEF DESCRIPTION OF THE DRAWINGS

For a more complete understanding of the present invention and its advantages, reference is now made to the following description, taken in conjunction with the accompanying drawings, in which.

DETAILED DESCRIPTION OF THE INVENTION

Figure 1:
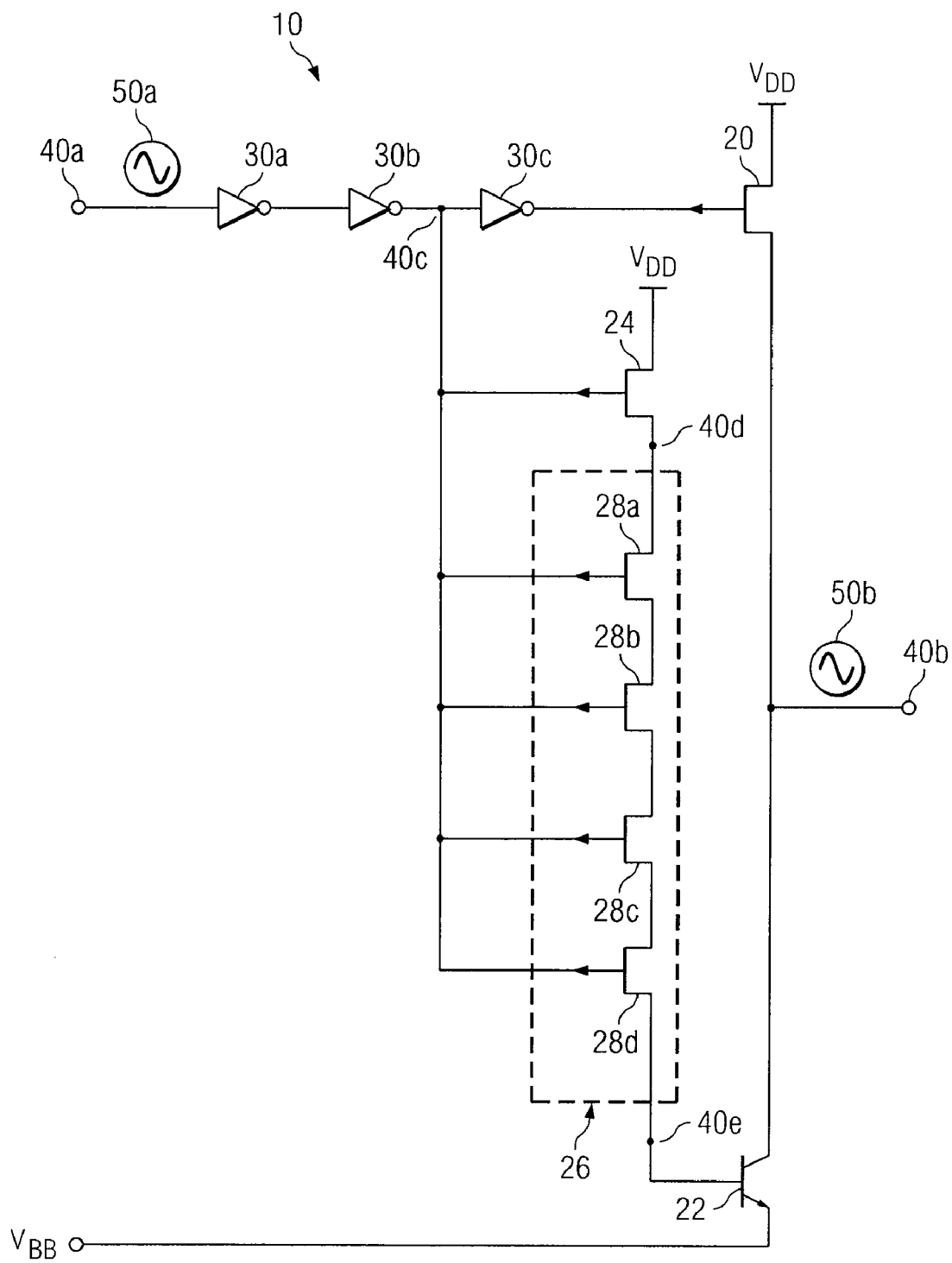
FIG. 1 illustrates a level-shifting circuit according to a particular embodiment of the present invention.

FIG. 1 illustrates a particular embodiment of a level-shifting circuit 10 that includes a first output transistor 20, a second output transistor 22, a pull-up transistor 24, a high-impedance element 26, and a plurality of inverters 30a-c. Level-shifting circuit 10 receives an input signal 50a having a voltage level within an input voltage range and, through the operation of pull-up transistor 24 and inverters 30a-c, selectively turns output transistors 20 and 22 on to generate an output signal 50b having a voltage level within an output voltage range. As described further below, by utilizing a bipolar junction transistor (BJT) for second output transistor 22, certain embodiments of level-shifting circuit 10 may be able to provide a greater voltage swing in the output voltage range.

More specifically, level-shifting circuit 10 may, in particular embodiments, include one or more junction field effect transistors (JFETs). These JFETs may be designed to turn on when a particular voltage differential (referred to here as the "operating voltage" of the JFET) is applied between the gate terminal and the source terminal of the JFET. Particular embodiments of JFETs may be designed to have a relatively low operating voltage. For example, in the illustrated embodiment, output transistor 20 and pull-up transistor 24 are JFETs that have an operating voltage of 0.5V.

Additionally, because the boundary between the gate terminal and the source terminal of such JFETs may form a pn-junction similar in structure and/or behavior to a pn-diode, there may be a limit (referred to here as the "cut-in voltage") on the voltage differential that can safely be applied across their gate-source junctions during normal operation. If the voltage across such a pn-junction is increased above its cut-in voltage, the pn-junction may become forward biased and a substantial amount of current may flow between the gate and source terminals, potentially damaging the JFET and/or causing other undesirable results in the operation or condition of the circuit. To avoid, the problems that may occur in such forward-biasing situations, level-shifting circuit 10 may include a BJT for second output transistor 22.

Figure 3A:
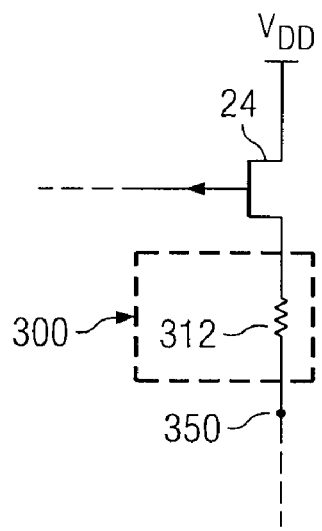
FIGS. 3A-3C illustrate example embodiments of high-impedance elements that may be included in certain embodiments of the level-shifting circuit.
Figure 3B:
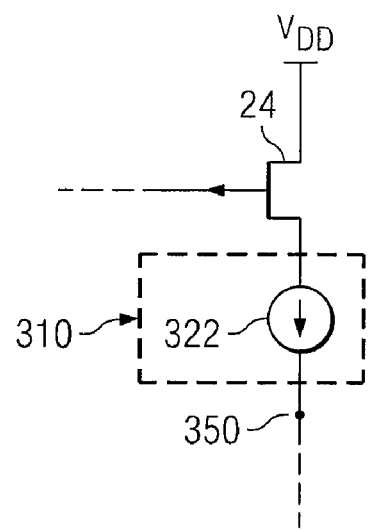
Figure 3C:
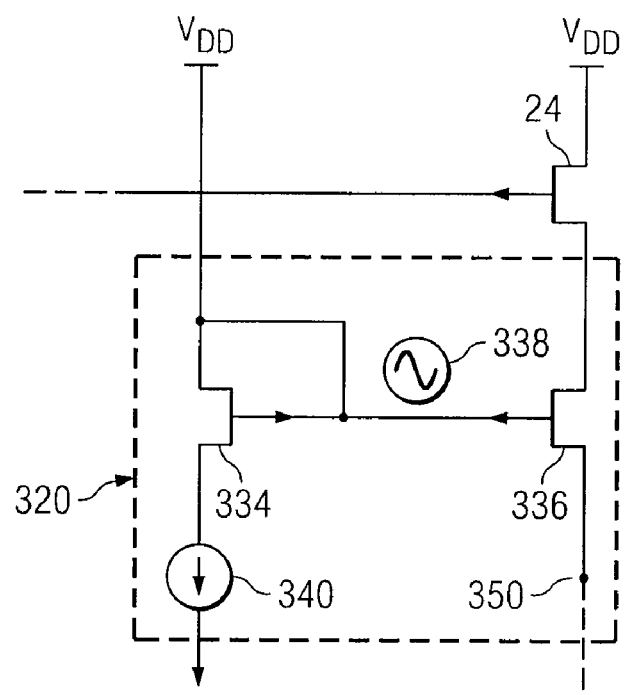

In addition to transistors 20, 22, and 24, the illustrated embodiment of level-shifting circuit 10 also includes high-impedance element 26. High-impedance element 26 provides a high-impedance path between nodes 40d and 40e. High-impedance element 26 may represent any appropriate component or collection of components suitable to provide a high-impedance path between two or more terminals of the component or collection of components. In the illustrated embodiment, high-impedance element 26 includes a plurality of high-impedance transistors 28a-d. FIGS. 3A-3C and the associated text describe various examples of alternative high-impedance element 26 that may be used in certain embodiments of level-shifting circuit 10.

In operation, level-shifting circuit 10 receives an input signal 50a and, in response to this input signal 50a, outputs an output signal 50b. Input signal 50a has a voltage level within an input voltage range defined by a first voltage level (e.g., a minimum voltage level) and a second voltage level (e.g., a maximum voltage level). Output signal 50b has a voltage level within an output voltage range also defined by a first voltage level and a second voltage level. In particular embodiments, the input voltage range differs from the output voltage range. More specifically, in particular embodiments, the output voltage range may have a different minimum and/or maximum voltage level from the input voltage range. Additionally, in particular embodiments, the output voltage range may cover a larger or smaller range of voltages than the input voltage range does. For example, in particular embodiments, the input voltage range covers a range of voltages from 0 V to 0.5 V and the output voltage range covers a range of voltages from −0.5 V to 0.5 V.

As shown in FIG. 1, level-shifting circuit 10 receives input signal 50a at input node 40a. Input node 40a couples to a gate terminal of first output transistor 20 through a series of one or more inverters 30 (inverters 30a-c in the illustrated example) and, as a result, input signal 50a selectively turns on first output transistor 20. Consequently, under appropriate conditions, first output transistor 20 couples output node 40b to the positive supply voltage ($V_{DD}$) and level-shifting circuit 10 outputs an output signal 50b having a voltage level substantially equal to the voltage level of the positive supply voltage, or $V_{DD}$ here.

Input node 40a also couples to a gate terminal of pull-up transistor 24. In particular embodiments, input node 40a may couple to gate terminal of pull-up transistor 24 through one or more inverters 30. As a result, input signal 50a selectively turns on pull-up transistor 24. For example, in the illustrated embodiment, input node 40a couples to the gate terminal of pull-up transistor 24 through inverters 30a and 30b. Thus, when input signal 50a has a voltage level equal to the high voltage within the input voltage range, the gate terminal of pull-up transistor 24 receives a high voltage and pull-up transistor 24 turns on.

When pull-up transistor 24 is turned on, the base terminal of second output transistor 22 is coupled to the positive supply voltage ($V_{DD}$) and the voltage level at the base terminal increases. Once the voltage level at the base terminal exceeds the base-to-emitter threshold voltage of second output transistor 22, second output transistor 22 starts conducting current between its collector terminal and its emitter terminal, coupling output node 40b to a negative supply voltage ($V_{BB}$). In response, the voltage level at output node 40b drops, and level-shifting circuit 10 outputs an output signal 50b having a voltage level equal to the voltage of the negative voltage supply, or $V_{BB}$ here. Thus, level-shifting circuit 10 outputs an output signal 50b having a voltage level within an output voltage range ($V_{BB}$ to $V_{DD}$ in the illustrated embodiment) that differs from an input voltage range associated with input signal 50a (0 to $V_{DD}$ in the illustrated embodiment).

Because second output transistor 22 comprises a BJT and is, therefore, capable of operating in the active mode with its base-emitter junction forward-biased, the voltage differential applied between the base and emitter terminals of second output transistor 22, in particular embodiments, can be greater than could be applied across the gate-source junction of certain types of JFETs. As a result, the inclusion of an second output transistor 22 that comprises a BJT may allow level-shifting circuit 10 to output an output signal 50b having a greater voltage swing than similar level-shifting circuits could using a JFET for second output transistor 22 and/or limit the number of additional components that are included in level-shifting circuit 10 to prevent forward biasing of second output transistor 22. Thus, in particular embodiments, level-shifting circuit 10 may provide several advantages. Nonetheless, specific embodiments of level-shifting circuit 10 may provide all, some, or none of these advantages.

Figure 2A:
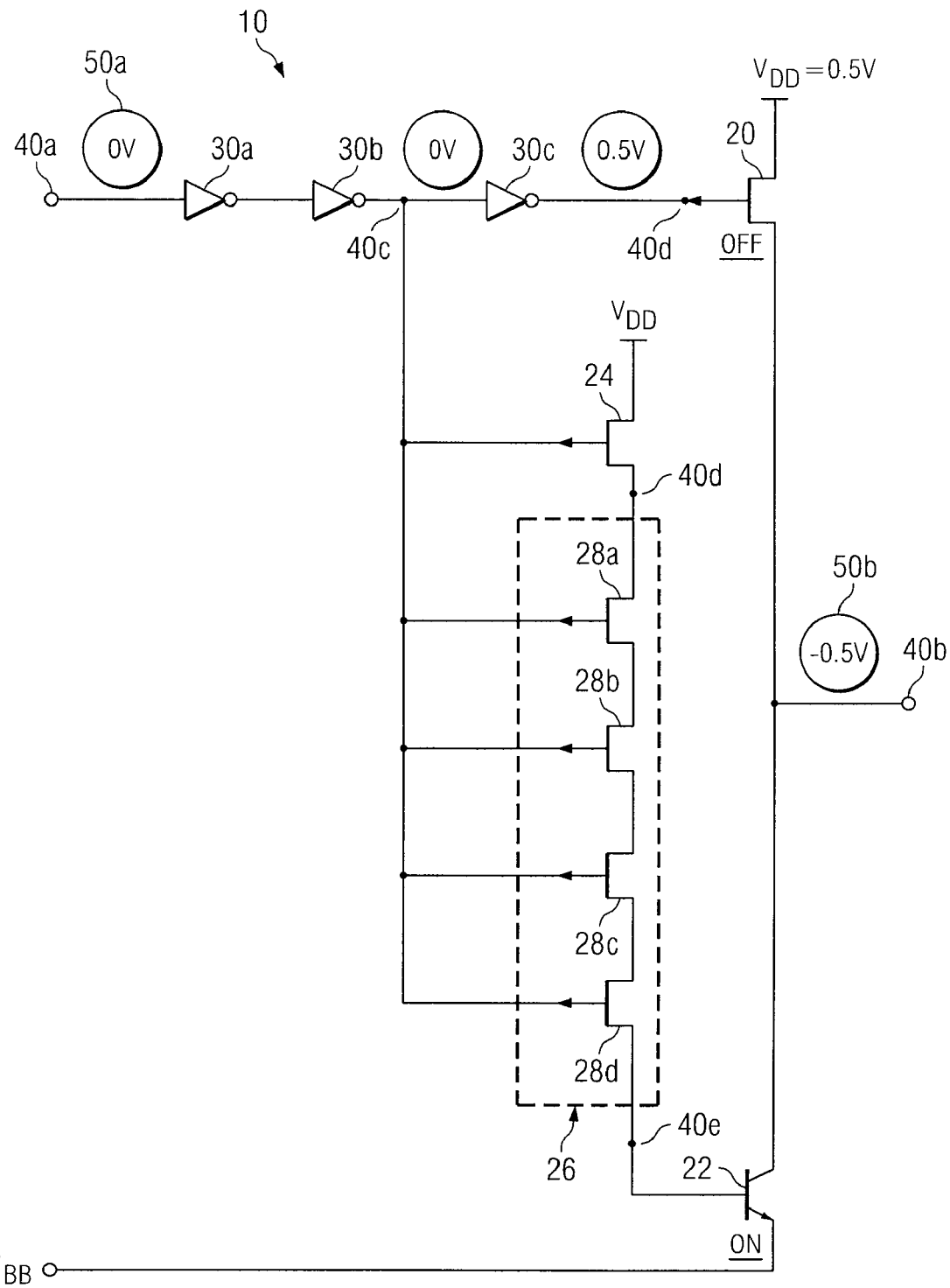
FIGS. 2A-2B show example operation of the level-shifting circuit of FIG. 1 in response to a particular set of input signals.
Figure 2B:
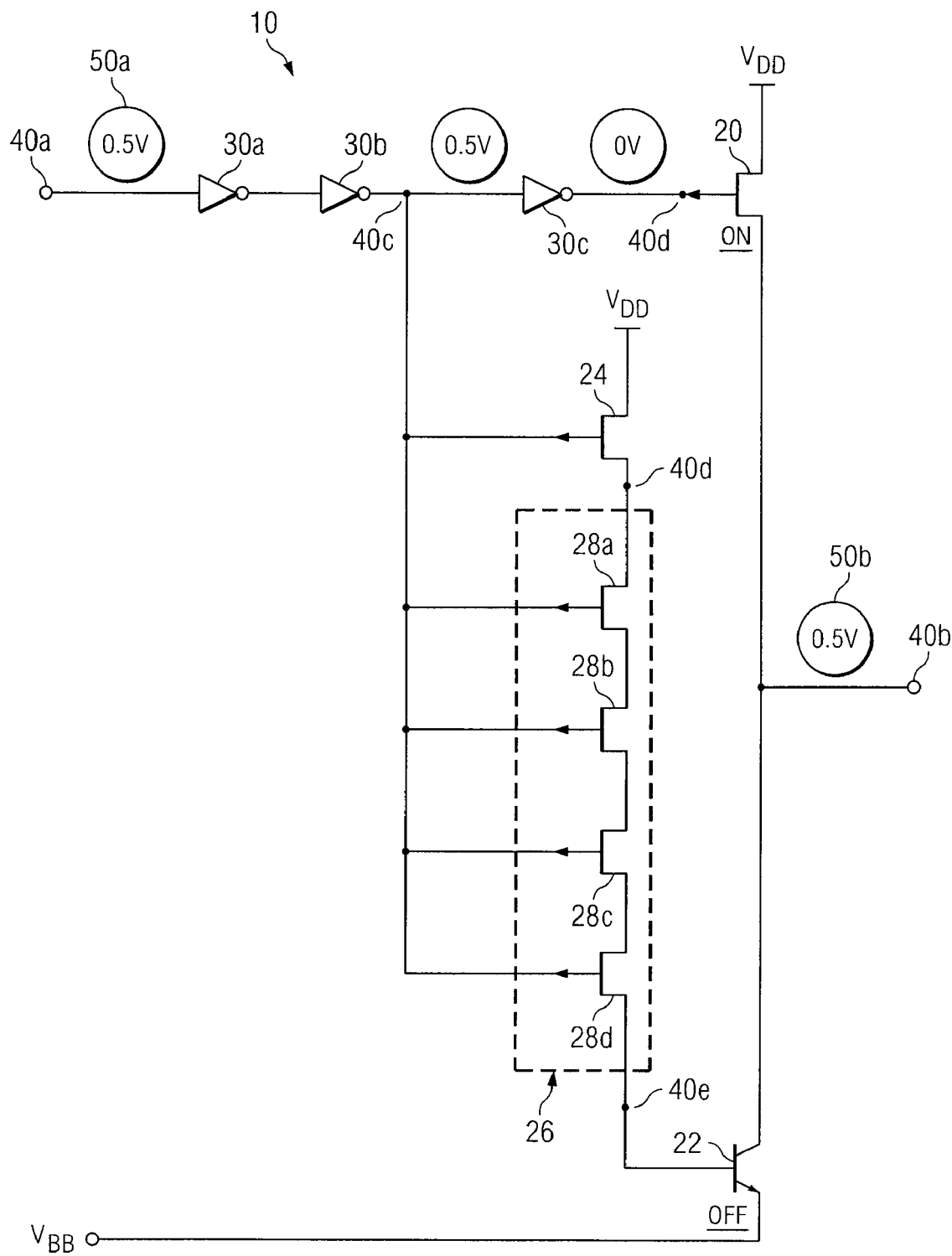

FIGS. 2A and 2B illustrate example operation of a particular embodiment of level-shifting circuit 10. In particular, FIG. 2A illustrates example operation of level-shifting circuit 10 in generating an output signal 50b in response to an input signal 50a having a voltage level equal to a low voltage within the input voltage range. By contrast, FIG. 2B illustrates example operation of level-shifting circuit 10 in generating an output signal 50b in response to an input signal 50a having a voltage level equal to the high voltage within the input voltage range. Although FIGS. 2A and 2B illustrate a particular embodiment of level-shifting circuit 10 that receives an input signal 50a having a voltage level within an input voltage range between 0 V and 0.5 V and produces an output signal 60b having a voltage level within an output voltage range between −0.5 V and 0.5 V, alternative embodiments may be configured to utilize and/or produce input signals 50a and output signals 50b within any appropriate ranges.

Furthermore, in the illustrated embodiment, first output transistor 20 and pull-up transistor 24 are assumed to represent JFETs having an operating voltage of 0.5 V. Moreover, in the illustrated embodiment, first output transistor 20 and pull-up transistor 24 are also assumed to have a cut-in voltage of 0.7 V. Thus, for example, the pn-junction formed between the source and gate terminals of the p-type first output transistor 20 will become forward-biased if a voltage greater than 0.7 V is applied across the source and gate terminals of first output transistor 20. Additionally, in the illustrated embodiment, first output transistor 20 and pull-up transistor 24 are also assumed to have a threshold voltage of 0.3 V. As a result, a limited amount of current begins to flow between the source and drain terminals of these transistors when the gate-source voltage differential (or source-gate voltage differential) exceeds 0.3 V even though the transistors are not fully turned on by that voltage differential. More generally, however, alternative embodiments of level-shifting circuit 10 may include any appropriate combination of transistors of any type, having any suitable operating and cut-in voltages.

In FIG. 2A, level-shifting circuit 10 receives an input signal 50a having a voltage level equal to the low voltage within the input voltage range associated with level-shifting circuit 10. As noted above, the input voltage range for the illustrated embodiment is assumed to be from 0 V to 0.5 V. Thus, in FIG. 2A, input signal 50a has a voltage of 0 V. When level-shifting circuit 10 receives a low voltage input signal 50a, inverter 30a outputs a high voltage (0.5 V in this example) and, as a result, inverter 30b outputs a low voltage (0 V in this example) at node 40c.

The low voltage at node 40c creates a voltage differential across the gate and source terminals of pull-up transistor 24 (0.5 V in this example) that exceeds the operating voltage of pull-up transistor 24. As a result, pull-up transistor 24 turns on. With pull-up transistor 24 turned on, current begins to flow from positive voltage supply through high-impedance element 26 to node 40e. Consequently, the voltage on node 40e rises. When the voltage on node 40e rises above the cut-in voltage of the base-to-emitter junction of second output transistor 22 and current starts flowing between the base and the emitter of second output transistor 22, the collector-to-emitter current flowing through second output transistor 22 also increases significantly (as a result of second output transistor 22 being a BJT). This causes second output transistor 22 to turn on, coupling output node 40b to negative voltage supply.

Additionally, because the voltage level at node 40c is low in the example of FIG. 2A, the output of inverter 30c is high. Thus, the voltage at the gate terminal of first output transistor 20 is high. This results in a voltage differential between the gate and drain terminals of first output transistor 20 that is approximately equal to 0V. As a result, first output transistor 20 turns off.

Thus, because second output transistor 22 is turned on and first output transistor 20 is turned off, the voltage level at node 50b, in the illustrated example, falls. As a result, level-shifting circuit 10 outputs an output signal 50b having a voltage level close to the low voltage in the output voltage range, or $V_{BB}$ (-0.5 V in this example). Consequently, in the illustrated embodiment, when level-shifting circuit 10 receives an input signal 50a having a voltage equal to the low voltage level in the input voltage range, level-shifting circuit 10 outputs an output signal having a voltage equal to the low voltage level in the output voltage range.

In FIG. 2B, level-shifting circuit 10 receives an input signal 50a having a voltage level equal to the high voltage within the input voltage range associated with level-shifting circuit 10. As noted above, the input voltage range for the illustrated embodiment is assumed to be from 0 V to 0.5 V. Thus, in FIG. 2B, input signal 50a has a voltage level of 0.5 V. When level-shifting circuit 10 receives a high voltage input signal 50a, inverter 30a outputs a low voltage (0 V in this example) and, as a result, inverter 30b outputs a high voltage (0.5 V in this example) at node 40c.

The high voltage at node 40c creates a voltage differential across the gate and source terminals of pull-up transistor 24 (0 V in this example) that is substantially equal to 0 V. As a result, pull-up transistor 24 turns off. With pull-up transistor 24 turned off, little or no current flows from the positive voltage supply through high-impedance element 26 to node 40e. Consequently, very little or no current flows through the base and emitter terminals of the second output transistor 22 under these circumstances. Because of the characteristics of a BJT, the limited current flowing between the base and emitter terminals results in an insignificant amount of current flowing between the collector and emitter terminals of the BJT and effectively creates a high-impedance path between the collector and emitter terminals. Second output transistor 22 essentially turns off as a result.

Additionally, because the voltage level at node 40c is high in the example of FIG. 2B, the output of inverter 30c is low (0 V in this example). Thus, the voltage at the gate terminal of first output transistor 20 is low. Because of the low voltage at its gate terminal, first output transistor 20 turns on. Furthermore, because first output transistor 20 is turned on and second output transistor 22 is turned off, the voltage level at node 50b, in the illustrated example, rises. Level-shifting circuit 10 outputs an output signal 50b having a voltage level equal to the high voltage in the output voltage range, or $V_{DD}$ (0.5 V in this example) as a result.

FIGS. 3A-3C illustrate various alternative embodiments of high-impedance element 26 that may be utilized in particular embodiments of level-shifting circuit 10. As noted above, high impedance elements 26 of FIGS. 1 and 2A-2B may each represent any appropriate component or collection of components suitable to provide a high impedance path between two or more terminals of the relevant component or collection of components. Thus, FIGS. 3A-3C illustrate various specific high-impedance elements that may be used in particular embodiments of level-shifting circuit 10.

FIG. 3A illustrates a portion of an example embodiment of level-shifting circuit 10 in which a high-impedance element (shown generically as "high-impedance element 300") comprises a resistor 312 connecting pull-up transistor 24 to a particular node of level-shifting circuit 10 (shown generically as "node 350"). The resistance of resistor 312 can be chosen based on current/voltage limitations for output transistors 20 and 22, timing requirements for level-shifting circuit 10, and/or any other appropriate design considerations.

FIG. 3B illustrates a portion of another example embodiment in which a high-impedance element (shown generically as "high-impedance element 310") comprises a constant current source 322. Like the resistance of resistor 312, the current output by constant current source 322 may be chosen based on current/voltage limitations for output transistors 20 and 22, timing requirements for level-shifting circuit 10, and/or any other appropriate design considerations.

FIG. 3C illustrates a portion of another example embodiment in which a high-impedance element (shown generically as "high-impedance element 320") represents a portion of a current mirror circuit that includes a biasing transistor 334 and a mirror transistor 336. As shown in FIG. 3C, the gate terminal of mirror transistor 336 couples to the gate terminal of biasing transistor 334. Current flows from the drain terminal of biasing transistor 334 to constant current source 350. Biasing transistor 334 provides a bias signal 338, which sets the maximum current that can flow from the source terminal to the drain terminal of mirror transistor 336. The illustrated current mirror circuit may be designed so that the current flowing through mirror transistor 336 is set to an appropriate level based on current limitations for output transistors 20 and 22, timing requirements for level-shifting circuit 10, and/or any other appropriate design considerations.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the scope of the appended claims.

What is claimed is:

1. A level-shifting circuit, comprising:
    an input node operable to receive an input signal within an input voltage range;
    a first output transistor operable to turn on when the input signal is at a first voltage level within the input voltage range and to couple an output node to a positive supply voltage when turned on;

a second output transistor operable to couple the output node to a negative supply voltage when turned on, wherein the second output transistor comprises a bipolar junction transistor; and a pull-up transistor operable to:
turn on when the input signal is at a second voltage level; and
generate a voltage at a base terminal of the second output transistor that is sufficient to turn the second output transistor on; and wherein the level-shifting circuit is operable to generate, at the output node, an output signal having a voltage level within an output voltage range and wherein a voltage swing associated with the output voltage range includes a positive voltage range and a negative voltage range.

2. The level-shifting circuit of claim 1, wherein the first output transistor comprises a junction field effect transistor (JFET).

3. The level-shifting circuit of claim 2, wherein the JFET is operable to turn on in response to a voltage differential of 0.5 volts being applied between a gate terminal of the JFET and a source terminal of the JFET.

4. The level-shifting circuit of claim 1, wherein the pull-up transistor comprises a JFET.

5. The level-shifting circuit of claim 1, further comprising a high-impedance element coupled to the base terminal of the second output transistor, and wherein a drain terminal of the pull-up transistor is coupled to the high-impedance element, and wherein current flows through the high-impedance element from the drain terminal of the pull-up transistor to the base terminal of the second output transistor when the pull-up transistor is turned on.

6. The level-shifting circuit of claim 1, wherein the output voltage range is greater than the input voltage range.

7. The level-shifting circuit of claim 1, wherein a maximum voltage of the output voltage range is greater than a maximum voltage of the input voltage range.

8. The level-shifting circuit of claim 1, wherein the input voltage range comprises a voltage range between 0 volts and 0.5 volts and the output voltage range comprises a voltage range between −0.5 volts and 0.5 volt.

9. A method for processing signals, comprising:
receiving an input signal having a voltage level within an input voltage range at an input node;
coupling an output node to a first supply voltage though a first output transistor when the input signal is at a first voltage level within the input voltage range;
increasing a voltage level at a base terminal of a second output transistor to a level that is sufficient to turn the second output transistor on and wherein the second output transistor comprises a bipolar junction transistor (BJT);
coupling the output node to a second supply voltage through the second output transistor when the second output transistor is turned on;
generating, at the output node, an output signal having a voltage level within an output voltage range, wherein a voltage swing associated with the output voltage range includes a positive voltage range and a negative voltage range.

10. The method of claim 9, wherein the first output transistor comprises a junction field effect transistor (JFET).

11. The method of claim 10, wherein the JFET is operable to turn on in response to a voltage differential of 0.5 volts being applied between a gate terminal of the JFET and a source terminal of the JFET.

12. The method of claim 9, wherein increasing a voltage level at the base terminal of the second output transistor comprises turning on a pull-up transistor when the input signal has a voltage equal to a second voltage level within the input voltage range, wherein the pull-up transistor, when turned on, is operable to increase the voltage level at the base terminal of the second output transistor.

13. The method of claim 12, wherein the pull-up transistor comprises a JFET.

14. The method of claim 9, wherein the output voltage range is greater than the input voltage range.

15. The method of claim 9, wherein a maximum voltage of the output voltage range is greater than a maximum voltage of the input voltage range.

16. The method of claim 9, wherein the input voltage range comprises a voltage range between 0 volts and 0.5 volts and the output voltage range comprises a voltage range between −0.5 volts and 0.5 volt.

17. A system for processing signals, comprising:
means for receiving an input signal having a voltage level within an input voltage range at an input node;
first switching means for coupling an output node to a first supply voltage when the input signal is at a first voltage level within the input voltage range;
means for increasing a voltage level at a base terminal of a bipolar junction transistor (BJT) associated with a second switching means to a level that is sufficient to turn on the BJT;
the second switching means for coupling the output node to a second supply voltage when the BJT is turned on;
means for generating, at the output node, an output signal having a voltage level within an output voltage range, wherein a voltage swing associated with the output voltage range includes a positive voltage range and a negative voltage range.

18. The system of claim 17, wherein the first switching means comprises a junction field effect transistor (JFET).

19. The system of claim 18, wherein the first switching means is operable to turn on in response to a voltage differential of 0.5 volts being applied between a gate terminal associated with the JFET and a source terminal associated with the JFET.

20. The system of claim 17, wherein the means for increasing the voltage level at the base terminal of the BJT the comprises a JFET.

21. The system of claim 17, wherein the output voltage range is greater than the input voltage range.

22. The system of claim 17, wherein a maximum voltage of the output voltage range is greater than a maximum voltage of the input voltage range.

23. The system of claim 17, wherein the input voltage range comprises a voltage range between 0 volts and 0.5 volts and the output voltage range comprises a voltage range between −0.5 volts and 0.5 volt.

* * * * *